(12) United States Patent
Bolsinger

(10) Patent No.: US 12,443,109 B2
(45) Date of Patent: Oct. 14, 2025

(54) EUV COLLECTOR

(71) Applicant: Carl Zeiss SMT GmbH, Oberkochen (DE)

(72) Inventor: Valentin Jonatan Bolsinger, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 488 days.

(21) Appl. No.: 18/147,976

(22) Filed: Dec. 29, 2022

(65) Prior Publication Data

US 2023/0146235 A1    May 11, 2023

Related U.S. Application Data

(63) Continuation of application No. PCT/EP2021/065907, filed on Jun. 14, 2021.

(30) Foreign Application Priority Data

Jul. 2, 2020  (DE) .......................... 102020208298.7

(51) Int. Cl.
G03F 7/00        (2006.01)
(52) U.S. Cl.
CPC ................ *G03F 7/70033* (2013.01)
(58) Field of Classification Search
None
See application file for complete search history.

(56) References Cited

U.S. PATENT DOCUMENTS

| | | |
|---|---|---|
| 6,859,515 B2 | 2/2005 | Schultz |
| 7,084,412 B2 | 8/2006 | Weiss |
| 9,541,685 B2 | 1/2017 | Kierey |
| 9,612,370 B1 | 4/2017 | Johnson |
| 2009/0289205 A1* | 11/2009 | Moriya ............... G02B 5/1838 250/504 R |

(Continued)

FOREIGN PATENT DOCUMENTS

| | | |
|---|---|---|
| DE | 10 2010 028 655 A1 | 11/2011 |
| DE | 10 2013 002 064 A1 | 8/2013 |

(Continued)

OTHER PUBLICATIONS

German Examination Report, with translation thereof, for corresponding DE Appl No. 10 2020 208 298.7, dated Jan. 19, 2021.

(Continued)

*Primary Examiner* — Kiet T Nguyen
(74) *Attorney, Agent, or Firm* — Fish & Richardson P.C.

(57) ABSTRACT

An EUV collector has a reflection surface with a basic mirror shape of a spherical section. A diffraction grating for EUV used light is applied to the reflection surface. The diffraction grating is designed so that the EUV used light, which emanates from a sphere center of the spherical section, is diffracted by the diffraction grating toward a collection region. The collection region is spatially spaced apart from the sphere center. This creates an EUV collector in which an effective separation between EUV used light, which is to be collected with the aid of the collector, and extraneous light having a wavelength that differs from a used light wavelength is made possible.

20 Claims, 5 Drawing Sheets

(56) References Cited

U.S. PATENT DOCUMENTS

| | | | | |
|---|---|---|---|---|
| 2010/0140512 A1* | 6/2010 | Suganuma | ............ | G03F 7/70891 |
| | | | | 250/504 R |
| 2010/0181503 A1* | 7/2010 | Yanagida | ............ | G03F 7/70033 |
| | | | | 250/504 R |
| 2017/0254995 A1* | 9/2017 | Bauer | ............ | G02B 19/0023 |

FOREIGN PATENT DOCUMENTS

| | | |
|---|---|---|
| DE | 10 2017 204 312 A1 | 11/2017 |
| DE | 10 2017 212 417 A1 | 6/2018 |
| WO | WO 2016/131069 A2 | 8/2016 |

OTHER PUBLICATIONS

Translation of International Search Report for corresponding PCT Appl No. PCT/EP2021/065907, dated Oct. 1, 2021.

* cited by examiner

EUV COLLECTOR

CROSS-REFERENCE TO RELATED APPLICATIONS

The present application is a continuation of, and claims benefit under 35 USC 120 to, international application PCT/EP2021/065907, filed Jun. 14, 2021, which claims benefit under 35 USC 119 of German Application No. 10 2020 208 298.7, filed Jul. 2, 2020. The entire disclosure of each of these applications is incorporated by reference herein.

FIELD

The disclosure relates to an EUV collector. Furthermore, the disclosure relates to a source-collector module comprising such an EUV collector, to an illumination optical unit for an EUV projection exposure apparatus comprising such an EUV collector, to a projection exposure apparatus comprising such an illumination optical unit, to a method for producing a microstructured or nanostructured component using such a projection exposure apparatus, and to a component produced using such a method.

BACKGROUND

An EUV collector is known from U.S. Pat. Nos. 9,541,685 B2, 7,084,412 B2, and from DE 10 2017 204 312 A1. Further design variants of an EUV collector are known from U.S. Pat. No. 9,612,370 B1 and DE 10 2013 002 064 A1.

SUMMARY

The present disclosure seeks to further develop an EUV collector in such a way that an effective separation between EUV used light, which is to be collected with the aid of the collector, and extraneous light having a wavelength that differs from a used light wavelength is made possible.

According to the disclosure, it has been recognized that it is possible to design an EUV collector in such a way that only the EUV used light, i.e. EUV light having the used light wavelength or having a used light wavelength bandwidth, is diffracted in the direction of a collection region, whereas the non-diffracted light, i.e. the extraneous light having a wavelength that differs from the EUV used light, is retroreflected by the reflection surface of the collector due to the basic mirror shape of a spherical section. A spatial separation of light paths of the EUV used light and of the extraneous light having a different wavelength can be achieved in this way. The diffraction grating can be designed here in such a way that expected extraneous-light wavelengths are not diffracted by the diffraction grating, and so these extraneous-light wavelengths are reflected by the basic mirror shape of the reflection surface and, if these extraneous-light wavelengths belong to extraneous-light rays emanating from the sphere center or pass through it, are retroreflected at the reflection surface.

In the case of the EUV collector, the reflection surface, which has the basic mirror shape of a spherical section, i.e. a spherical surface, is designed to guide the EUV used light.

The diffraction grating can be radially symmetric about a connecting line between the sphere center and a center of the collection region. A diffraction angle that is produced by the diffraction grating for the EUV used light, i.e. an angle between a beam of EUV used light that is incident on the diffraction grating and the beam then diffracted by the diffraction grating, can be in the range between 0° and 45°. This diffraction angle is optionally in the range between 2° and 45° and for example between 5° and 45° or between 5° and 40°.

Overall, an EUV collector with a relatively high diffraction efficiency for the EUV used light can be attained.

A grating period d of the diffraction grating depending on a distance R of a respective grating section from a connecting line between the sphere center and a center of the collection region varies between a minimum grating period and a maximum grating period. In such embodiments, the grating period can be adapted to the geometric conditions for the diffraction of the EUV used light toward a collection region. A variation of the grating period can be continuous or be graduated. For example, a plurality of diffraction grating surface sections which are at different distances from the connecting line can be designed with a continuous or graduated grating period variation. These diffraction grating surface sections can be embodied in the form of surface sections of the diffraction grating that are closed around the connecting line.

In some embodiments, a grating period d can be in the range between 10 nm and 4000 nm. Such grating periods have proven to be used in practice, since such grating periods are the result of corresponding geometric considerations and have additionally been found to be producible with reasonable effort. In addition, such grating periods can lie below a typical coherence length of certain current EUV light sources, such as plasma sources.

In some embodiments, the diffraction grating can be a binary grating, a multi-step grating or a blazed grating. Such grating variants can provide a good diffraction efficiency for the EUV used light, which can be greater than 40%, 45%, 50%, 55%, 60%, 65%, 70%, 75%, 80%, 85%, 90% and which can even be greater than 95%. A combination of these grating variants is also possible.

In some embodiments, a separation b between the sphere center and the center of the collection region can be between 50 mm and 4000 mm. Such a distance between the sphere center and the center of the collection region can help ensure a good spatial separation between the EUV used light and the extraneous light reflected toward the sphere center.

In some embodiments, at least one light trap for extraneous light not diffracted at the diffraction grating is provided. Such a light trap can help ensure that the extraneous light is removed in a defined manner. The light trap can have a symmetric shape adapted to the symmetry of the EUV collector and/or to the symmetry of a diffraction effect of the diffraction grating. The light trap can have the basic shape of a sleeve or a tube. A tubular cross section of the light trap between a trap inlet opening and a trap outlet opening can be designed such that it decreases, for example decreases linearly. The light trap may have a frustoconical longitudinal section.

In some embodiments, the basic mirror shape of the reflection surface is approximated to a spherical section surface by a polyhedron. This can help avoid continuously curved surfaces, which can help in grating production.

In some embodiments, the number of polyhedron faces of the polyhedrons is greater than 10. This can help enable a reasonable production effort. The number can be greater than 50 and can be greater than 100. The number can be less than 10,000, for example less than 1,000. The number can be in the range between 50 and 500 or in the range between 100 and 250 or in the range between 250 and 500. Numbers in the range between 50 and 100 or in the range between 250 and 1,000 or between 500 and 1,000 are also possible.

In some embodiments, a source-collector module includes an EUV light source and an EUV collector as described herein. Such a module can have features as described herein in connection with the EUV collector. The EUV light source may be a plasma source, which for example has an infrared pump laser. If a source region of the light source lies in the region of the sphere center of the sphere section of the basic mirror shape of the reflection surface of the collector, pumped light retroreflected at the reflection surface passes through the source region at least one more time, which can increase the pump efficiency of the light source. The diffraction grating of the EUV used collector can be designed in such a way that a wavelength range of the pumped light is not diffracted at the diffraction grating. The pumped light is therefore extraneous light that is not to be diffracted by the diffraction grating.

In comparison with collectors in which extraneous light of higher wavelengths is diffracted, the diffraction structures of the diffraction grating of the collector according to the disclosure, which diffract the EUV used light, can have smaller structure depths, which can lead to shorter etching times in an etching production process. The EUV used light can be separated from extraneous light so effectively that lithography masks without a protective film, for example without a pellicle, can be used during the projection exposure, which further reduces reflection losses.

In some embodiments, the disclosure provides an illumination optical unit for an EUV projection exposure apparatus includes an EUV collector, a projection exposure apparatus including such an illumination optical unit, a production method which includes using such a projection exposure apparatus to make a microstructured or nanostructured component, and/or a component produced by such a method. The component produced can be a microchip, for example a memory chip.

BRIEF DESCRIPTION OF THE DRAWINGS

Exemplary embodiments of the disclosure are described in greater detail below with reference to the drawing, in which.

EXEMPLARY EMBODIMENTS

Firstly, the general construction of a microlithographic projection exposure apparatus 1 will be described.

Figure 1:
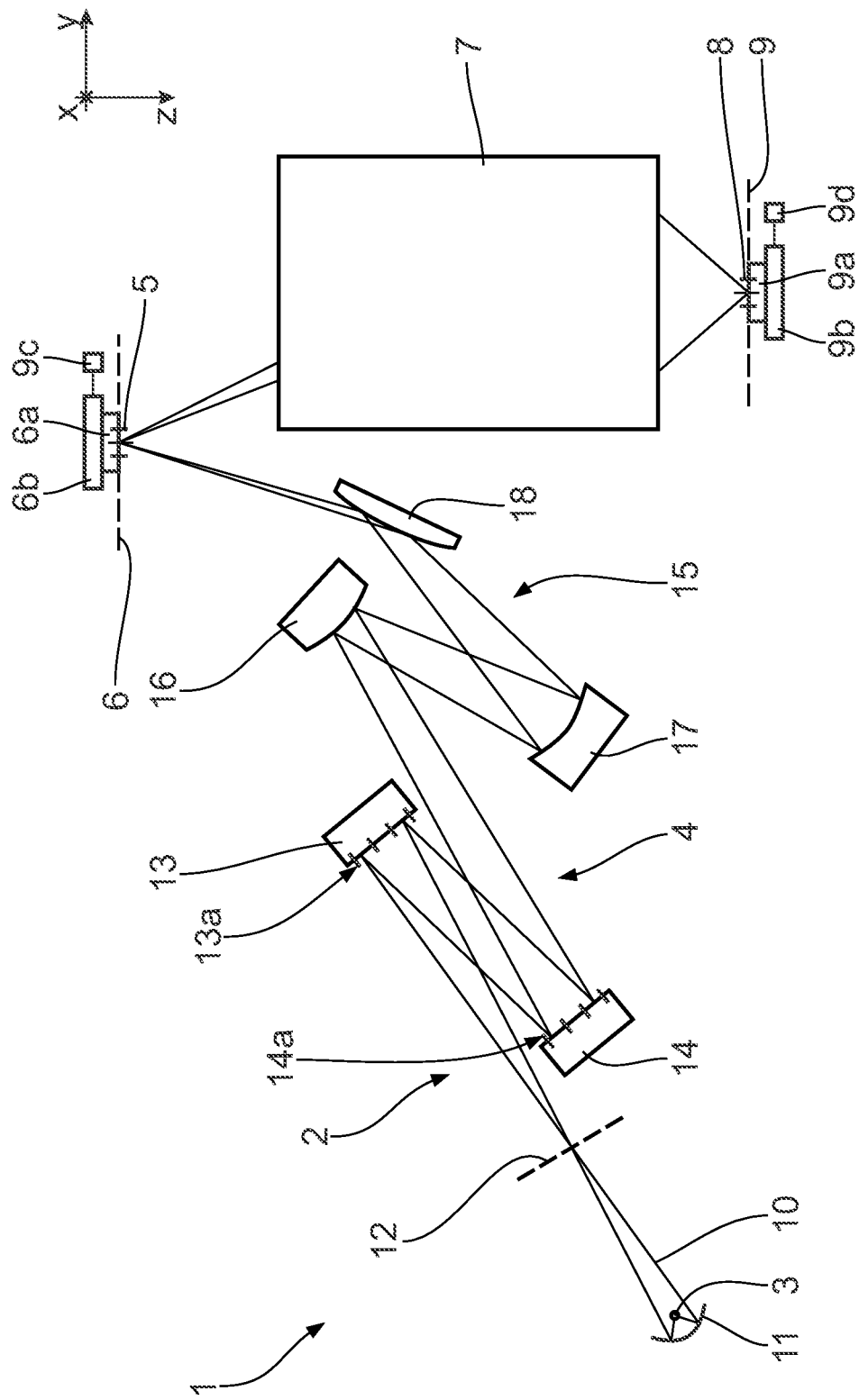
FIG. 1 schematically shows a meridional section of a projection exposure apparatus for EUV projection lithography.

A Cartesian xyz-coordinate system is used for description purposes. In FIG. 1, the x-axis extends perpendicularly to the plane of the drawing into the latter. The y-axis extends toward the right. The z-axis extends downward. In connection with the description of individual components, a local Cartesian xyz-coordinate system is used in FIG. 2 et seq., which is arranged such that the x-axis of the local coordinate system extends parallel to the x-axis of the global coordinate system according to FIG. 1 and the x- and y-axes in each case span a principal plane approximated to a respective optical surface.

FIG. 1 schematically shows a meridional section of a microlithographic projection exposure apparatus 1. An illumination system 2 of the projection exposure apparatus 1 has, besides a radiation source 3, an illumination optical unit 4 for the exposure of an object field 5 in an object plane 6. In this case, a reticle 6a arranged in the object field 5 is exposed, said reticle being held by a reticle holder 6b. A projection optical unit 7 serves for imaging the object field 5 into an image field 8 in an image plane 9. A structure on the reticle is imaged onto a light-sensitive layer of a wafer 9a arranged in the region of the image field 8 in the image plane 9, said wafer being held by a wafer holder 9b.

The reticle holder 6b is driven by a reticle displacement drive 9c and the wafer holder 9b is driven by a wafer displacement drive 9d. The drives via the two displacement drives 9c, 9d are effected in a manner synchronized with one another along the y-direction.

The radiation source 3 is an EUV radiation source with emitted used radiation in the range of between 5 nm and 30 nm. This can be a plasma source, for example a GDPP (gas discharge-produced plasma) source or an LPP (laser-produced plasma) source. By way of example, tin can be excited to form a plasma via a carbon dioxide laser operating at a wavelength of 10.6 μm, that is to say in the infrared range. A radiation source based on a synchrotron can also be used for the radiation source 3. A person skilled in the art can find information relating to such a radiation source for example in U.S. Pat. No. 6,859,515 B2.

EUV radiation 10 emanating from the radiation source 3 is focused by a collector 11, which is described in more detail below. Downstream of the collector 11, the EUV radiation 10 propagates through an intermediate focal plane 12 before being incident on a field facet mirror 13 with a multiplicity of field facets 13a. The field facet mirror 13 is disposed in a plane of the illumination optical unit 4 which is optically conjugate with respect to the object plane 6.

The EUV radiation 10 is also referred to hereinafter as illumination light or as imaging light.

Downstream of the field facet mirror 13, the EUV radiation 10 is reflected by a pupil facet mirror 14 with a multiplicity of pupil facets 14a. The pupil facet mirror 14 is arranged in a pupil plane of the illumination optical unit 4, which is optically conjugate with respect to a pupil plane of the projection optical unit 7. With the aid of the pupil facet mirror 14 and an imaging optical assembly in the form of a transfer optical unit 15 having mirrors 16, 17 and 18 designated according to their order in the beam path, the field facets 13a of the field facet mirror 13 are imaged into the object field 5 in a manner being superimposed on one another. The last mirror 18 of the transfer optical unit 15 is a grazing incidence (GI) mirror.

Figure 2:
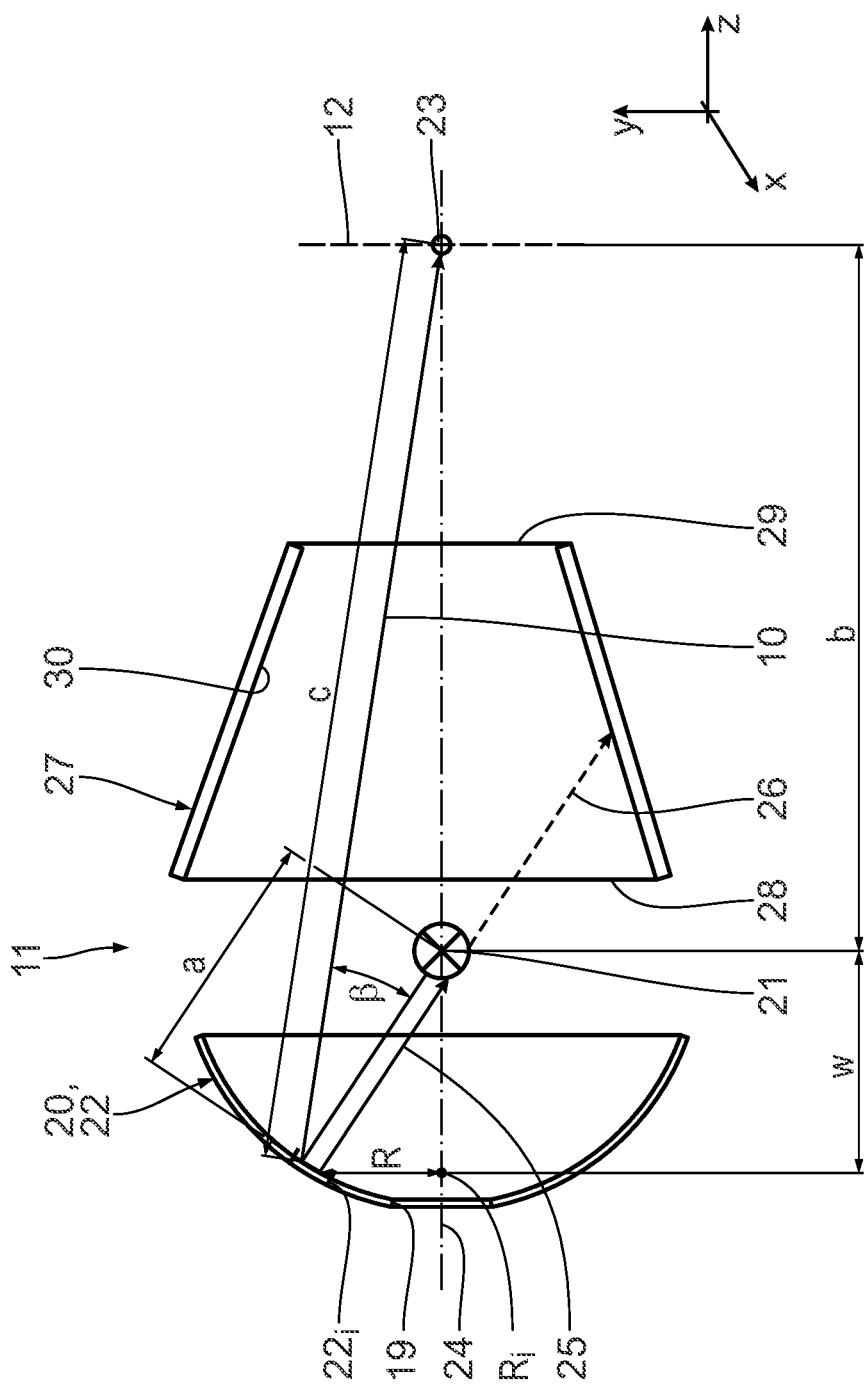
FIG. 2 shows a meridional section through a collector of the projection exposure apparatus.

FIG. 2 shows the collector 11 in greater detail. If the radiation source 3 is embodied as an LPP source, said collector has a through opening 19 for pumped light for producing the plasma. Said pumped light can have a pumped light wavelength in the infrared wavelength range, for example of 10.6 µm.

The collector 11 has a reflection surface 20 with a basic mirror shape of a spherical section. This basic mirror shape is designed in the manner of a spherical mirror. A sphere radius of this basic mirror shape of the reflection surface 20 is denoted by a in FIG. 2. The sphere radius a is measured from a sphere center, in which a plasma source region 21 of the radiation source 3 is arranged. As a rule, the sphere center lies also in the center of the plasma source region 21, and the reference sign 21 in FIG. 2 therefore also denotes the sphere center.

The basic mirror shape can reproduce an exact spherical section. Alternatively, it is possible to approximate the basic mirror shape to a spherical section surface, for example using a polyhedron, as will be described below. A "sphere center" of such a polyhedron corresponds to the sphere center of the approximated spherical section surface.

Figure 3:
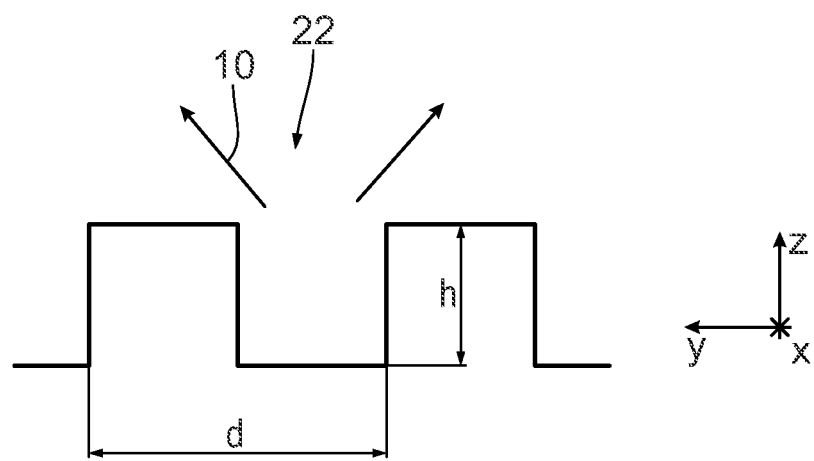
FIG. 3 shows a section perpendicular to grating structures through an embodiment of a diffraction grating for EUV used light, wherein the diffraction grating is applied on a reflection surface of the collector.

A diffraction grating 22 is applied to the reflection surface 20, which is not shown in detail in FIG. 2 and which is shown in FIG. 3, greatly enlarged in sections, in a section perpendicular to a course of grating structures.

The design of the diffraction grating 22 according to FIG. 3 is a binary grating with a grating period d and a diffraction structure height h.

The diffraction grating 22 on the reflection surface 20 of the EUV collector 11 is designed in such a way that the EUV illumination light 10, which emanates from the source region 21 in the sphere center of the spherical section of the basic mirror shape of the reflection surface 20, is diffracted by the diffraction grating 22 toward a collection region 23, which is the intermediate focus in the intermediate focal plane 12. The collection region 23 is spatially spaced apart from the source region 21 in the sphere center by a distance b.

In order to dimension the diffraction grating 22 with regard to the grating period d and the diffraction structure height h, grating surface sections $22_i$ extending radially symmetrically about an axis of rotational symmetry 24 of the diffraction grating 22 are considered.

FIG. 2 shows an example of the reflection conditions on such a surface section $22_i$ of the diffraction grating 22. A distance of the surface section $22_i$ from the axis of rotational symmetry 24 is denoted by R in FIG. 2. A radius of the spherical section-shaped surface section $22_i$ is denoted by a. A diffraction angle of the illumination light 10 emanating from the source region 21 at the surface section $22_i$ is denoted by β. A distance between a reference point $R_i$ of the distance R on the axis of rotational symmetry 24 and the sphere center source region 21 is denoted by w in FIG. 2. This reference point $R_i$ is at the same time an impingement point of the illumination light 10 emanating from the source region 21 onto the diffraction grating 22 in the subsequent determination of the diffraction angle. A distance between this reference point $R_i$ and the collection region 23 is denoted by c in FIG. 2.

The following applies to the diffraction angle β:

$$\cos(\beta) = \frac{(a^2 + c^2 - b^2)}{2ac} \quad (1)$$

where: $w^2 = a^2 - R_i^2$ and $c^2 = R_i^2 + (w+b)^2$.

The respective value for the diffraction angle β for the surface section $22_i$ under consideration can then be inserted into the grating equation for the grating period d $$d = \lambda/\sin \beta \quad (2).$$

λ is here the used wavelength of the illumination light 10.

The diffraction structure height h at a wavelength λ of the illumination light 10 of λ=13 nm lies in the region of h≈13 nm for the binary diffraction grating according to FIG. 3. A distance value R of 50 mm and a radius a of 200 mm as well as a distance b between the source region 21 and the collection region 23 of 1000 mm result in a diffraction angle β of 12° and this results in a grating period d of 62 nm for a wavelength λ of 13 nm.

The table below gives further assignments of values for the diffraction angle β and the grating period d for different values of R, a and b.

| R [mm] | a [mm] | b [mm] | β [deg] | d [nm] |
|--------|--------|--------|---------|--------|
| 50     | 200    | 1000   | 12      | 62     |
| 50     | 1000   | 1000   | 1.4     | 520    |
| 50     | 100    | 100    | 0.3     | 2860   |
| 1000   | 1000   | 1000   | 45      | 18     |
| 1000   | 1000   | 100    | 5.7     | 130    |
| 1000   | 2000   | 100    | 2.9     | 260    |

The grating period d of the diffraction grating 22 is therefore dependent, among other things, on the distance R of the respective grating section $22_i$ from the axis of rotational symmetry 24, i.e. from the connecting line between the sphere center (source region 21) and the collection region 23, and varies between a minimum grating period and a maximum grating period. The smaller the diffraction angle β is, the larger may be the grating period d.

The grating period d of the diffraction grating 22 can vary, depending on the distance R of the surface section $22_i$ that is respectively under consideration from the axis of rotational symmetry 24 and depending on the sphere radius a and on the distance b between the source region 21 and the collection region 23, for example in the range between 10 nm and 4000 nm.

The maximum grating period d is chosen so that it is smaller than a coherence length of the radiation source 3.

The illumination light 10 is diffracted at diffraction angles β in the range between 0° and 45°, for example.

The distance b can lie in the range between 50 mm and 4000 mm.

A diffraction efficiency of the binary diffraction grating 22 according to FIG. 3 can be in the region of 40%. This diffraction efficiency denotes the intensity ratio between the illumination light 10 diffracted by the diffraction grating 22 and the illumination light 10 that is incident on the diffraction grating 22.

Since the reflection surface 20 of the collector 11 is spherical, light or radiation components that are not diffracted by the diffraction grating 22 and that emanate from the source region 21 with a different wavelength than the used light wavelength of the illumination light 10 are reflected back by the reflection surface 20. A beam path of such extraneous light 25, which is pumped light for example, but also other wavelengths generated by the plasma in the source region 21, is shown in solid lines in FIG. 2 up to the source region 21 and then in dashed lines at 26. If the extraneous light 25 is pumped light, the retroreflection of the pumped light 25 at the reflection surface 20 and the subsequent renewed passage through the source region 21 can result in an increase in the pumping efficiency and thus in the efficiency of the radiation source 3.

A light trap 27 for the non-diffracted extraneous light 25 is arranged in the further course of the extraneous light beam path. As can be seen in the embodiment in FIG. 2, the light trap 27 has a frustoconical longitudinal section. The light trap 27 has an inlet opening 28 facing the reflection surface 20 with an inlet opening cross section and an outlet opening 29 facing the collection region 23 with an outlet opening cross section, which is smaller than the inlet opening cross section.

An inner wall 30 of the light trap 27 is designed to absorb the extraneous light 25. The light trap 27 can be thermally coupled to a heat sink.

An average reflectivity of the collector 11 for the illumination light 10 where its reflection surface 20 has no diffraction grating can also be greater than 50%, can be greater than 52%, can be greater than 55%, can be greater than 60%, and can also be even greater.

Figure 4:
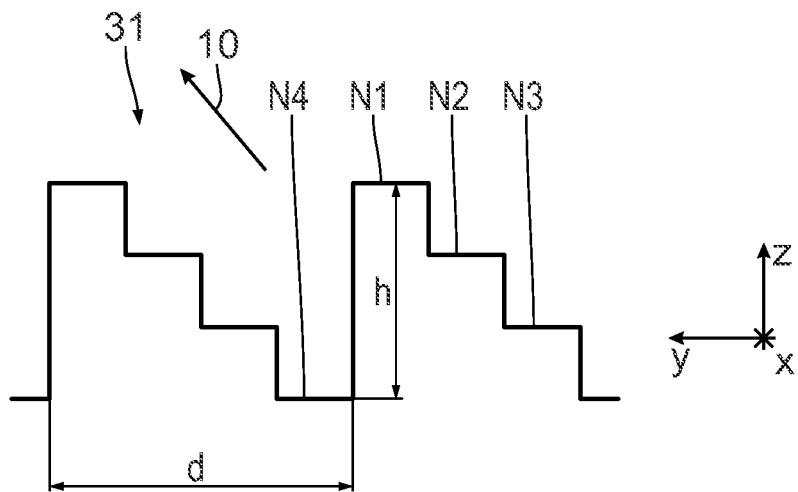
FIG. 4 shows a further embodiment of a diffraction grating for the collector in an illustration similar to FIG. 3.

A further embodiment for a grating structure of a diffraction grating 31 is described below with reference to FIG. 4, which can be used in the collector 11 instead of the diffraction grating 22 according to FIG. 3. Components and functions corresponding to those which have already been explained above with reference to FIGS. 1 to 3 are provided with the same reference signs and will not be discussed in detail again.

The diffraction grating 31 is an echelon grating with a total of four step levels $N_1$, $N_2$, $N_3$ and $N_4$. A level difference between adjacent steps $N_1/N_2$, $N_2/N_3$ and $N_3/N_4$ is the same size in each case. Between the adjacent steps $N_4/N_1$, i.e. at the transition between two grating periods, there is a triple level difference, specifically the entire diffraction structure height h. A y-extent of the different levels $N_1$ is the same size in each case and is d/4. A diffraction efficiency of the diffraction grating 31 can lie in the region of 80%.

Figure 5:
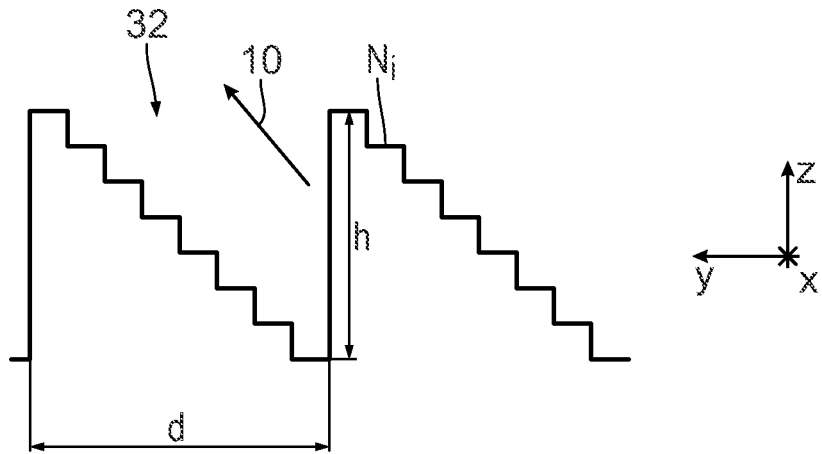
FIG. 5 shows a further embodiment of a diffraction grating for the collector in an illustration similar to FIG. 3.

A further embodiment for a grating structure of a diffraction grating 32 is described below with reference to FIG. 5, which can be used in the collector 11 instead of the diffraction grating 22 according to FIG. 3. Components and functions corresponding to those which were already explained above with reference to FIGS. 1 to 3 are denoted by the same reference signs and are not discussed in detail again.

The diffraction grating 32 is an eight-step grating with corresponding levels $N_1$ and a level difference between adjacent levels within the grating period d of h/8. A diffraction efficiency of the diffraction grating 32 can be greater than 90% and can lie in the region of 95%.

Figure 6:
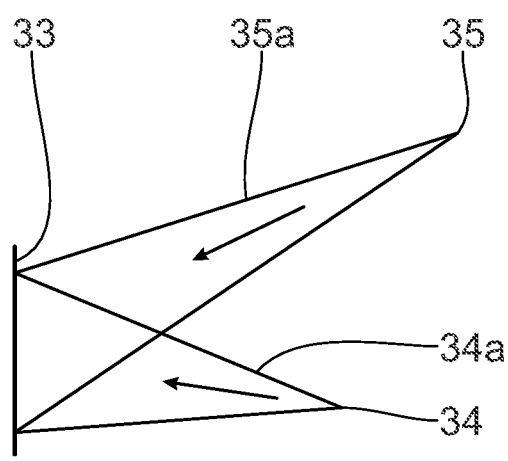
FIG. 6 schematically shows a snapshot of a substrate illumination as part of a method for producing a diffraction grating of one of the embodiments according to FIGS. 3 to 5.

FIG. 6 shows a snapshot during the production of a diffraction grating of the type of the diffraction grating 22. A grating substrate 33, which is shown schematically as a planar surface in FIG. 6 but is actually spherically curved like the reflection surface 20 of the collector 11, is illuminated by two coherent structure light sources 34, 35 having a wavelength in the range between 10 nm and 4000 nm. The structure light sources 34, 35 can be infrared light sources, light sources in the visible wavelength spectrum, excimer light sources, or EUV light sources.

On the side facing the structure light sources 34, 35, the grating substrate 33 has a light-sensitive coating including a multilayer coating made of molybdenum/silicon.

Emissions 34a, 35a from the structure light sources 34, 35 interfere with one another on the grating substrate 33 and form a standing wave there, which can be used on a light-sensitive layer of the grating substrate 33 for subsequent structuring, i.e. for producing the diffraction structures of the diffraction grating 22, via an etching step.

As an alternative to the grating structuring described above, the respective diffraction grating 22, 31, 32 can also be produced with the aid of near-field mask illumination. Electron beam lithography or illumination with EUV wavelengths can also be used for the diffraction grating structure production.

The basic mirror shape of the reflection surface 20 in the form of a spherical section can be approximated to the spherical section surface by a polyhedron. Examples of such polyhedrons 36, 37, 38 are shown in FIGS. 7 to 9.

Figure 7:
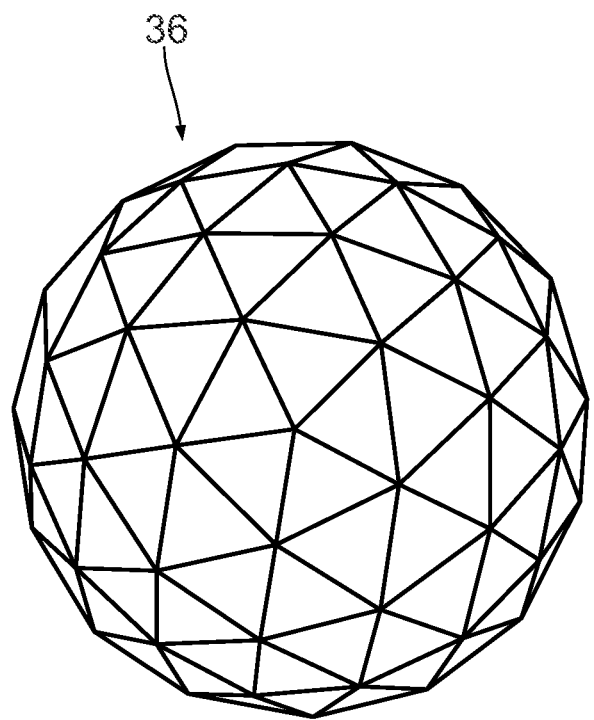
FIGS. 7 to 9 show different embodiments for designs of a basic mirror shape of the collector, each of which is approximated to a spherical section surface by an embodiment of a polyhedron, shown in each case as an approximated full spherical section surface, of which only a partial section is used for the collector.
Figure 8:
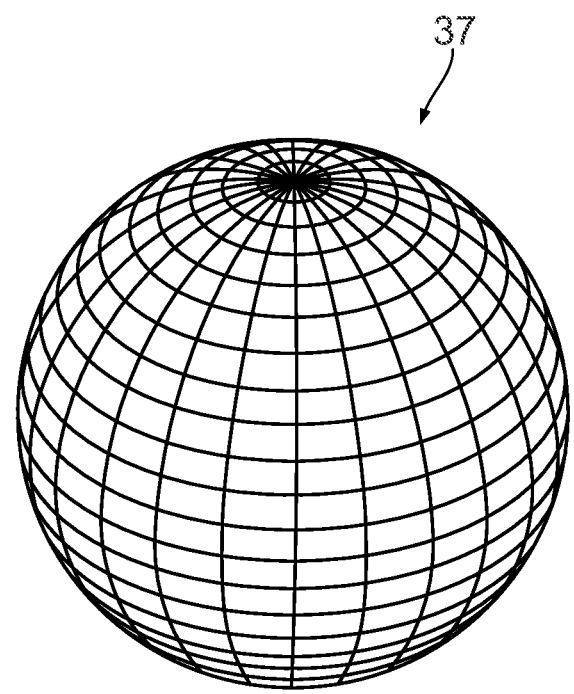

FIG. 7 shows a spherical surface polyhedron composed of triangles. The spherical surface polyhedron 37 according to FIG. 8 is bounded by lines corresponding to the longitude and latitude of a globe.

Figure 9:
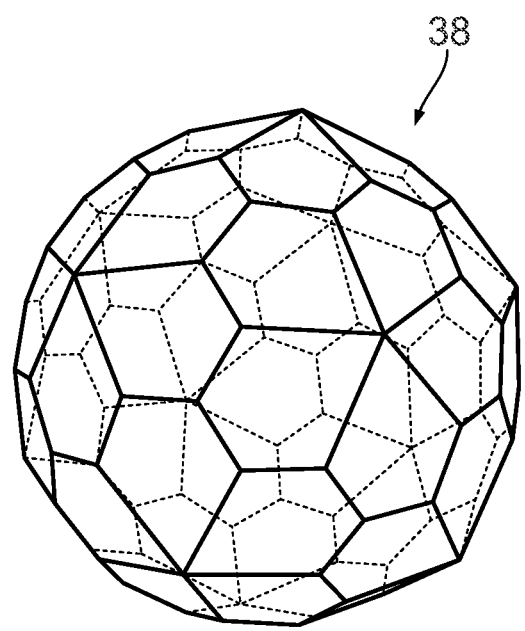

The spherical surface polyhedron 38 according to FIG. 9 is bounded by pentagons.

A hemispherical polyhedron corresponding to the polyhedrons 36 to 38 is approximately used for the basic shape of the reflection surface 20 of the collector 11. A hemispherical separating surface in the polyhedron 37 can run along the equator or along a meridian.

A diffraction grating of the collector 11 in the manner of the diffraction gratings 22, 31 and 32 can also be designed as a blazed diffraction grating in which the grating structures are inclined such that the angle of inclination specifies a reflection direction for the illumination light 10 which matches the diffraction angle β.

The number of polyhedron faces of the polyhedrons 36, 37, 38 is greater than 10 and can be less than 10,000, for example less than 1,000.

With the aid of the projection exposure apparatus 1, at least one part of the reticle in the object field 5 is imaged onto a region of a light-sensitive layer on the wafer in the image field 8 for the lithographic production of a microstructured or nanostructured component, for example of a semiconductor component, for example of a microchip. Depending on the embodiment of the projection exposure apparatus 1 as a scanner or as a stepper, the reticle and the wafer are moved in the y-direction in a temporally synchronized manner continuously in scanner operation or step by step in stepper operation.

What is claimed is:

1. An EUV collector, comprising:
   a reflection surface comprising a basic mirror shape of a spherical section; and
   a diffraction grating supported by the reflection surface, wherein:
   the diffraction grating is configured so that, during use of the EUV collector, used light emanates from a sphere center of the spherical section and is diffracted by the diffraction grating toward a collection region; and
   the collection region is spatially spaced apart from the sphere center.

2. The collector of claim 1, wherein, depending on a distance of a respective grating section from a connecting line between the sphere center and a center of the collection region, a grating period of the diffraction grating varies between a minimum grating period and a maximum grating period.

3. The collector of claim 2, wherein the grating period is between 10 nm and 4,000 nm.

4. The collector of claim 3, wherein the diffraction grating comprises a member selected from the group consisting of a binary grating, a multi-step grating, and a blazed grating.

5. The collector of claim 3, wherein a separation between the sphere center and a center of the collection region is between 50 mm and 4,000 mm.

6. The collector of claim 3, further comprising a light trap configured to trap extraneous light not diffracted at the diffraction grating.

7. The collector of claim 3, wherein the basic mirror shape of the reflection surface is approximated to a spherical section surface by a polyhedron.

8. The collector of claim 7, wherein a number of polyhedron faces of the polyhedron is greater than 10.

9. The collector of claim 1, wherein the grating has a grating period between 10 nm and 4,000 nm.

10. The collector of claim 9, wherein the diffraction grating comprises a member selected from the group consisting of a binary grating, a multi-step grating, and a blazed grating.

11. The collector of claim 10, wherein a separation between the sphere center and a center of the collection region is between 50 mm and 4,000 mm.

12. The collector of claim 1, wherein the diffraction grating comprises a member selected from the group consisting of a binary grating, a multi-step grating, and a blazed grating.

13. The collector of claim 1, wherein a separation between the sphere center and a center of the collection region is between 50 mm and 4,000 mm.

14. The collector of claim 1, further comprising a light trap configured to trap extraneous light not diffracted at the diffraction grating.

15. The collector of claim 1, wherein the basic mirror shape of the reflection surface is approximated to a spherical section surface by a polyhedron.

16. The collector of claim 15, wherein a number of polyhedron faces of the polyhedron is greater than 10.

17. A source-collector module, comprising:
an EUV light source; and
an EUV collector according to claim 1.

18. An illumination optical unit, comprising:
an EUV collector according to claim 1.

19. A projection exposure apparatus, comprising:
an EUV light source; and
an illumination optical unit comprising an EUV collector according to claim 1; and
a projection optical unit,
wherein the EUV illumination optical unit is configured to transfer illumination light from the EUV light source into an object field, and the projection optical unit is configured to image the object field into an image field.

20. A method of using a projection exposure apparatus which comprises an illumination optical unit and a projection optical unit, the method comprising:
using the illumination optical unit to transfer illumination light from an EUV light source into an object field; and
using the projection optical unit to image the object field into an image field,
wherein the illumination optical unit comprises an EUV collector according to claim 1.

* * * * *

UNITED STATES PATENT AND TRADEMARK OFFICE
CERTIFICATE OF CORRECTION

PATENT NO. : 12,443,109 B2
APPLICATION NO. : 18/147976
DATED : October 14, 2025
INVENTOR(S) : Valentin Jonatan Bolsinger Page 1 of 1

It is certified that error appears in the above-identified patent and that said Letters Patent is hereby corrected as shown below:

In the Specification

Column 7, Line 35, delete "$N_1$" and insert -- $N_i$ --.

Column 7, Line 47, delete "$N_1$" and insert -- $N_i$ --.

Signed and Sealed this
Twenty-fifth Day of November, 2025

John A. Squires
*Director of the United States Patent and Trademark Office*